(12) United States Patent
Ramkumar

(10) Patent No.: US 8,685,813 B2
(45) Date of Patent: Apr. 1, 2014

(54) METHOD OF INTEGRATING A CHARGE-TRAPPING GATE STACK INTO A CMOS FLOW

(75) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 74 days.

(21) Appl. No.: 13/428,201

(22) Filed: Mar. 23, 2012

(65) Prior Publication Data

US 2013/0210209 A1     Aug. 15, 2013

Related U.S. Application Data

(60) Provisional application No. 61/599,258, filed on Feb. 15, 2012.

(51) Int. Cl.
*H01L 21/8238* (2006.01)

(52) U.S. Cl.
USPC .... 438/211; 438/201; 257/314; 257/E29.129; 257/E29.03

(58) Field of Classification Search
USPC ........ 257/314, E29.129, E29.3; 438/201, 211
See application file for complete search history.

(56) References Cited

U.S. PATENT DOCUMENTS

| | | |
|---|---|---|
| 4,395,438 A | 7/1983 | Chiang |
| 4,490,900 A | 1/1985 | Chiu |
| 4,843,023 A | 6/1989 | Chiu et al. |
| 4,870,470 A | 9/1989 | Bass, Jr. et al. |
| 5,404,791 A | 4/1995 | Ahmad et al. |
| 5,405,791 A | 4/1995 | Ahmad et al. |
| 5,408,115 A | 4/1995 | Chang |
| 5,464,783 A | 11/1995 | Kim et al. |
| 5,500,816 A | 3/1996 | Kobayashi |
| 5,573,963 A | 11/1996 | Sung |

(Continued)

FOREIGN PATENT DOCUMENTS

| | | |
|---|---|---|
| CN | 101558481 A | 10/2009 |
| WO | 2008129478 A | 10/2008 |
| WO | 2011162725 A | 12/2011 |

OTHER PUBLICATIONS

Hue-Ching Chien, Chin-Hsing Kao, Jui-Wen Chang and Tzung-Kuen Tsai_Two-bit SONOS type Flash using a band engineering in the nitride layer_Dated Jun. 17, 2005_4 pages.

(Continued)

*Primary Examiner* — Kyoung Lee
*Assistant Examiner* — Ratisha Mehta

(57) ABSTRACT

Embodiments of a method of integration of a non-volatile memory device into a MOS flow are described. Generally, the method includes: forming a dielectric stack on a surface of a substrate, the dielectric stack including a tunneling dielectric overlying the surface of the substrate and a charge-trapping layer overlying the tunneling dielectric; forming a cap layer overlying the dielectric stack; patterning the cap layer and the dielectric stack to form a gate stack of a memory device in a first region of the substrate and to remove the cap layer and the charge-trapping layer from a second region of the substrate; and performing an oxidation process to form a gate oxide of a MOS device overlying the surface of the substrate in the second region while simultaneously oxidizing the cap layer to form a blocking oxide overlying the charge-trapping layer. Other embodiments are also disclosed.

18 Claims, 12 Drawing Sheets

(56) References Cited

U.S. PATENT DOCUMENTS

| | | |
|---|---|---|
| 5,793,089 A | 8/1998 | Fulford et al. |
| 5,817,170 A | 10/1998 | Desu et al. |
| 5,861,347 A | 1/1999 | Maiti et al. |
| 5,937,323 A | 8/1999 | Orczyk et al. |
| 5,939,333 A | 8/1999 | Hurley et al. |
| 5,972,765 A | 10/1999 | Clark et al. |
| 5,972,804 A | 10/1999 | Tobin et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,136,654 A | 10/2000 | Kraft et al. |
| 6,140,187 A | 10/2000 | Debusk et al. |
| 6,147,014 A | 11/2000 | Lyding et al. |
| 6,150,286 A | 11/2000 | Sun et al. |
| 6,153,543 A | 11/2000 | Chesire et al. |
| 6,162,700 A | 12/2000 | Hwang et al. |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Lee et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 | 8/2002 | Ramsbey et al. |
| 6,440,797 B1 | 8/2002 | Wu et al. |
| 6,444,521 B1 | 9/2002 | Chang et al. |
| 6,445,030 B1 | 9/2002 | Wu et al. |
| 6,468,927 B1 | 10/2002 | Zhang et al. |
| 6,518,113 B1 | 2/2003 | Buynoski |
| 6,559,026 B1 | 5/2003 | Rossman et al. |
| 6,586,343 B1 | 7/2003 | Ho et al. |
| 6,586,349 B1 | 7/2003 | Jeon et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,713,127 B2 | 3/2004 | Subramony et al. |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,833,582 B2 | 12/2004 | Mine et al. |
| 6,835,621 B2 | 12/2004 | Yoo et al. |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,912,163 B2 | 6/2005 | Zheng et al. |
| 6,913,961 B2 | 7/2005 | Hwang |
| 6,917,072 B2 | 7/2005 | Noguchi et al. |
| 6,946,349 B1 * | 9/2005 | Lee et al. ............... 438/275 |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B2 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukada et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,544,565 B2 | 6/2009 | Kwak et al. |
| 7,576,386 B2 | 8/2009 | Lue et al. |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,646,637 B2 | 1/2010 | Liao |
| 7,670,963 B2 | 3/2010 | Ramkumar et al. |
| 7,714,379 B2 | 5/2010 | Lee |
| 7,723,789 B2 | 5/2010 | Lin et al. |
| 7,737,488 B2 | 6/2010 | Lai et al. |
| 7,790,516 B2 | 9/2010 | Willer et al. |
| 7,799,670 B2 | 9/2010 | Ramkumar et al. |
| 7,879,738 B2 | 2/2011 | Wang |
| 7,910,429 B2 | 3/2011 | Dong et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,093,128 B2 | 1/2012 | Koutny, Jr. et al. |
| 8,143,129 B2 | 3/2012 | Ramkumar et al. |
| 8,222,688 B1 | 7/2012 | Jenne et al. |
| 8,283,261 B2 | 10/2012 | Ramkumar |
| 8,318,608 B2 | 11/2012 | Ramkumar et al. |
| 2001/0052615 A1 | 12/2001 | Fujiwara |
| 2002/0020890 A1 | 2/2002 | Willer |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0227049 A1 | 12/2003 | Sakakibara |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0173918 A1 | 9/2004 | Kamal et al. |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0251489 A1 | 12/2004 | Jeon et al. |
| 2005/0026637 A1 | 2/2005 | Fischer et al. |
| 2005/0070126 A1 | 3/2005 | Senzaki |
| 2005/0093054 A1 | 5/2005 | Jung |
| 2005/0098839 A1 | 5/2005 | Lee et al. |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |

(56) References Cited

U.S. PATENT DOCUMENTS

| | | |
|---|---|---|
| 2005/0275012 A1 | 12/2005 | Nara et al. |
| 2006/0017092 A1* | 1/2006 | Dong et al. .......... 257/314 |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0281331 A1 | 12/2006 | Wang |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0210371 A1 | 9/2007 | Hisamoto et al. |
| 2007/0246753 A1 | 10/2007 | Chu et al. |
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0029399 A1 | 2/2008 | Tomita et al. |
| 2008/0048237 A1 | 2/2008 | Iwata |
| 2008/0057644 A1 | 3/2008 | Kwak et al. |
| 2008/0087942 A1 | 4/2008 | Hsu et al. |
| 2008/0135946 A1 | 6/2008 | Yan |
| 2008/0146042 A1 | 6/2008 | Kostamo et al. |
| 2008/0150003 A1 | 6/2008 | Chen et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0293207 A1 | 11/2008 | Koutny, Jr. et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0152621 A1 | 6/2009 | Polishchuk et al. |
| 2009/0179253 A1* | 7/2009 | Levy et al. .......... 257/324 |
| 2009/0227116 A1 | 9/2009 | Joo et al. |
| 2009/0243001 A1 | 10/2009 | Ramkumar et al. |
| 2009/0302365 A1 | 12/2009 | Bhattacharyya |
| 2010/0041222 A1 | 2/2010 | Puchner et al. |
| 2010/0117138 A1 | 5/2010 | Huerta et al. |
| 2010/0252877 A1 | 10/2010 | Nakanishi et al. |
| 2010/0295118 A1 | 11/2010 | Bhattacharyya |
| 2011/0237060 A1 | 9/2011 | Lee et al. |
| 2011/0248332 A1 | 10/2011 | Levy et al. |
| 2013/0175504 A1 | 7/2013 | Levy et al. |
| 2013/0175600 A1 | 7/2013 | Jenne et al. |
| 2013/0175604 A1 | 7/2013 | Polishchuk et al. |
| 2013/0178031 A1 | 7/2013 | Ramkumar et al. |

OTHER PUBLICATIONS

Krishnaswamy Ramkumar_Cypress SONOS Technology_Dated Jul. 6, 2011_9 pages.

Search Report for U.S. Appl. No. 12/428,201, Dated Mar. 2012, 12 pages.

"MAX 9000 Programmable Logic Device Family," Altera, Jul. 1999, Version 6.01, pp. 1-40; 41 pages.

L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.

"1.8V, 500-MHz, 10-Output JEDEC-Compliant Zero Delay Buffer," Cypress Advance Information, Feb. 12, 2004; 9 pages.

"10 Gigabit Ethernet Technology Overview White Paper", Revision 1.0, Retrieved from Internet: URL: http://www.10gea.org, May 2001.

"16K x 8/9 Dual-Port Static RAM with Sem, Int, Busy," Cypress Semiconductor Data Book, May 1995, CY7C006 and CY7C016, pp. 6:1-17; 10 pages.

"1K x 8 Dual-Port Static RAM," Cypress Semiconductor Data Book, May 1995, CY7C1301CY7C131 and CY7C140/CY7C141, pp. 6:37-49; 8 pages.

"1kHz to 30MHz Resistor Set SOT-23 Oscillator", Initial Release Final Electrical Specifications LTC1799, Linear Technology Corporation, Jan. 2001, pp. 1-4.

"200-MBaud HOTLink Transceiver," Cypress Semiconductor Corporation, Revised Feb. 13, 2004, CY7C924ADX, Document #38-02008 Rev. *D; 62 pages.

"2K x 16 Dual-Port Static RAM," Cypress Semiconductor Data Book, May 1995, CY7C133 and CY7C143, pp. 6:63-73; 7 pages.

"2K x 8 Dual-Port Static RAM," Cypress Semiconductor Data Book, May 1995, CY7C1321CY7C136 and CY7C142/CY7C146, pp. 6:50-62; 8 pages.

"3.3V 64K x 18 Synchronous QuadPort Static RAM," Cypress Preliminary CY7C0430BV, Cypress Semiconductor Corporation, Mar. 27, 2001; 36 pages.

USPTO Non Final Rejection for U.S. Appl. No. 12/006,961 dated Jun. 24, 2010; 8 pages.

USPTO Non Final Rejection for U.S. Appl. No. 12/030,644 dated May 28, 2010; 19 pages.

USPTO Non Final Rejection for U.S. Appl. No. 12/080,166 dated Jun. 30, 2010; 11 pages.

USPTO Non Final Rejection for U.S. Appl. No. 12/767,105 dated Apr. 21, 2011; 7 pages.

USPTO Non Final Rejection for U.S. Appl. No. 12/767,105 dated Oct. 18, 2011; 7 pages.

USPTO Non Final Rejection for U.S. Appl. No. 13/114,889 dated Sep. 5, 2013; 11 pages.

USPTO Non Final Rejection for U.S. Appl. No. 13/114,889 dated Nov. 25, 2011; 13 pages.

USPTO Non Final Rejection for U.S. Appl. No. 13/431,069 dated Aug. 16, 2013; 7 pages.

USPTO Non Final Rejection for U.S. Appl. No. 13/436,878 dated Jul. 24, 2013; 12 pages.

USPTO Non Final Rejection for U.S. Appl. No. 13/539,458 dated Mar. 13, 2013; 5 pages.

USPTO Non Final Rejection for U.S. Appl. No. 13/551,237 dated Jul. 18, 2013; 6 pages.

USPTO Non-Final Rejection for U.S. Appl. No. 11/811,958 dated May 13, 2009; 14 pages.

USPTO Non-Final Rejection for U.S. Appl. No. 11/811,958 dated Oct. 1, 2012; 17 pages.

USPTO Non-Final Rejection for U.S. Appl. No. 12/124,855 dated Jan. 18, 2011; 5 pages.

USPTO Non-Final Rejection for U.S. Appl. No. 12/124,855 dated Aug. 16, 2011; 9 pages.

USPTO Non-Final Rejection for U.S. Appl. No. 12/124,855 dated Oct. 29, 2009; 9 pages.

USPTO Non-Final Rejection for U.S. Appl. No. 12/185,747 dated Aug. 16, 2009; 15 pages.

USPTO Non-Final Rejection for U.S. Appl. No. 12/197,466 dated Jun. 1, 2011; 11 pages.

USPTO Non-Final Rejection for U.S. Appl. No. 13/114,889 dated Oct. 10, 2012; 11 pages.

USPTO Notice of Allowance for U.S. Appl. No. 11/904,506 dated Oct. 28, 2013; 9 pages.

USPTO Notice of Allowance for U.S. Appl. No. 11/904,513 dated Oct. 9, 2009; 7 pages.

USPTO Notice of Allowance for U.S. Appl. No. 12/006,961 dated Mar. 15, 2011; 8 pages.

(56) References Cited

OTHER PUBLICATIONS

USPTO Notice of Allowance for U.S. Appl. No. 12/006,961 dated Jul. 26, 2011; 8 pages.
USPTO Notice of Allowance for U.S. Appl. No. 12/006,961 dated Oct. 14, 2010; 4 pages.
USPTO Notice of allowance for U.S. Appl. No. 12/080,166 dated Sep. 1, 2011; 9 pages.
USPTO Notice of Allowance for U.S. Appl. No. 12/080,166 dated Mar. 31, 2011; 7 pages.
USPTO Notice of Allowance for U.S. Appl. No. 12/080,166 dated Sep. 30, 2010; 6 pages.
USPTO Notice of Allowance for U.S. Appl. No. 12/080,175 dated May 14, 2010; 10 pages.
USPTO Notice of Allowance for U.S. Appl. No. 12/124,855 dated May 1, 2012; 7 pages.
USPTO Notice of Allowance for U.S. Appl. No. 12/124,855 dated May 13, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/185,751 dated Nov. 2, 2012; 7 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 12/767,105 dated Apr. 4, 2012; 8 pages.
USPTO Notice of Allowance for U.S. Appl. No. 12/767,105 dated May 7, 2012; 7 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013; 9 pages.
USPTO Notice of Allowance for U.S. Appl. No. 13/007,533 dated Nov. 27, 2012; 8.
USPTO Notice of Allowance for U.S. Appl. No. 13/539,458 dated May 24, 2013; 8 pages.
USPTO Notice of Allowance for U.S. Appl. No. 13/551,237 dated Oct. 29, 2013; 9 pages.
USPTO Office Action for U.S. Appl. No. 13/007,533 dated Sep. 24, 2012; 13 pages.
USPTO Requirement for Restriction for U.S. Appl. No. 11/904,506 dated Apr. 13, 2010; 7 pages.
USPTO Requirement for Restriction for U.S. Appl. No. 11/904,513 dated Oct. 7, 2008; 8 pages.
USPTO Requirement for Restriction for U.S. Appl. No. 12/030,644 dated Oct. 7, 2009; 11 pages.
USPTO Requirement for Restriction for U.S. Appl. No. 12/080,166 dated Mar. 19, 2010; 6 pages.
USPTO Requirement for Restriction for U.S. Appl. No. 12/080,175 dated Feb. 3, 2010; 6 pages.
USPTO Requirement for Restriction for U.S. Appl. No. 12/767,105 dated Mar. 1, 2011; 6 pages.
U.S. Appl. No. 13/431,069 "SONOS Stack With Split Nitride Memory Layer" Fredrick Jenne et al., filed Mar. 27, 2012; 59 pages.
U.S. Appl. No. 13/539,458 "Radical Oxidation Process for Fabricating a Nonvolatile Charge Trap Memory Device"., filed Jul. 1, 2012; 96 pages.
U.S. Appl. No. 13/539,461 "SONOS Ono Stack Scaling," Fredrick Jenne, filed Jul. 1, 2012; 91 pages.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
Chinese Office Action for Application No. 200880000820.3 dated Jan. 26, 2011; 6 pages.

International Search Report for International Application No. PCT/US07/20966 dated Apr. 21, 2008; 2 pages.
International Search Report for International Application No. PCT/US07/20988 dated Mar. 14, 2008; 2 pages.
International Search Report for International Application No. PCT/US12/021583 dated May 8, 2012; 2 pages.
International Search Report for International Application No. PCT/US13/29784 dated May 20, 2013; 2 pages.
International Search Report for International Application No. PCT/US13/32339 dated May 30, 2013; 2 pages.
International Search Report for International Application No. PCT/US13/32777 dated Jun. 20, 2013; 2 pages.
International Search Report for International Application No. PCT/US13/48876 dated Jul. 26, 2013; 5 pages.
International Search Report for International Application No. PCT/US2008/006627 dated Aug. 26, 2008; 2 pages.
Lue et al., "Be-Sonos: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
Milton Ohring, "The Materials Science of Thin Films: Deposition and Structure," 2nd Edition, Academic Press, 2002, pp. 336-337; 4 pages.
PCT International Search Report and Written Opinion for International Application Number, PCT/US07/20965 filed Sep. 28, 2007, mailed Apr. 21, 2008, 2 pages.
SIPO Office Action for Application No. 200780035963.3 dated Feb. 29, 2012; 4 pages.
Suhane et al., "Experimental Evaluation of Trapping Efficiency in Silicon Nitride Based Charge Trapping Memories", Solid State Device Research Conference, 2009, 4 pages.
The Written Opinion of the International Searching Authority for International Application No. PCT/US08/06597 mailed Aug. 19, 2008; 5 pages.
USPTO Advisory Action for U.S. Appl. No. 11/811,958 dated Mar. 16, 2010; 4 pages.
USPTO Advisory Action for U.S. Appl. No. 11/811,958 dated Apr. 20, 2010; 6 pages.
USPTO Advisory Action for U.S. Appl. No. 11/811,958 dated May 14, 2013; 4 pages.
USPTO Advisory Action for U.S. Appl. No. 11/811,958 dated Jun. 2, 2011; 5 pages.
USPTO Advisory Action for U.S. Appl. No. 11/904,506 dated Aug. 30, 2011; 4 pages.
USPTO Advisory Action for U.S. Appl. No. 12/197,466 dated Jan. 31, 2012; 3 pages.
USPTO Advisory Action for U.S. Appl. No. 13/114,889 dated Aug. 2, 2013; 2 pages.
USPTO Advisory Action for U.S. Appl. No. 13/114,889 dated Aug. 29, 2012; 3 pages.
USPTO U.S. Appl. No. 12/006,961 "Oxynitride Bilayer Formed Using a Precursor Inducing a High Charge Trap Density in a Loop Layer" Sagy Levy et al., filed Jan. 8, 2008; 30 pages.
USPTO Final Rejection for U.S. Appl. No. 11/811,958 dated Jan. 6, 2010; 17 pages.
USPTO Final Rejection for U.S. Appl. No. 11/811,958 Dated Mar. 13, 2013; 22 pages.
USPTO Final Rejection for U.S. Appl. No. 11/811,958 dated Mar. 15, 2011; 13 pages.
USPTO Final Rejection for U.S. Appl. No. 11/904,513 dated Jun. 24, 2009; 12 pages.
USPTO Final Rejection for U.S. Appl. No. 11/904,506 dated Jun. 7, 2011; 15 pages.
USPTO Final Rejection for U.S. Appl. No. 12/030,644 dated Jan. 24, 2011; 22 pages.
USPTO Final Rejection for U.S. Appl. No. 12/124,855 dated Jan. 31, 2012; 7 pages.
USPTO Final Rejection for U.S. Appl. No. 12/124,855 dated May 10, 2010; 11 pages.
USPTO Final Rejection for U.S. Appl. No. 12/197,466 dated Nov. 17, 2011; 13 pages.
USPTO Final Rejection for U.S. Appl. No. 13/007,533 dated Sep. 24, 2012; 13 pages.

(56) References Cited

OTHER PUBLICATIONS

USPTO Final Rejection for U.S. Appl. No. 13/114,889 dated Apr. 2, 2013; 12 pages.
USPTO Final Rejection for U.S. Appl. No. 13/114,889 dated Jun. 4, 2012; 12 pages.
USPTO Final Rejection for U.S. Appl. No. 13/551,237 dated Oct. 11, 2013; 8 pages.
USPTO Miscellaneous Internal Document for U.S. Appl. No. 12/030,644 dated May 28, 2010; 6 pages.
USPTO Non Final Office Action for U.S. Appl. No. 13/114,889 dated Sep. 5, 2013; 11 pages.
USPTO Non Final Rejection for U.S. Appl. No. 11/811,958 dated May 13, 2009; 14 pages.
USPTO Non Final Rejection for U.S. Appl. No. 11/811,958 dated Oct. 7, 2010; 12 pages.
USPTO Non Final Rejection for U.S. Appl. No. 11/811,958 dated Dec. 7, 2011; 13 pages.
USPTO Non Final Rejection for U.S. Appl. No. 11/904,513 dated Dec. 10, 2008; 11 pages.
USPTO Non Final Rejection for U.S. Appl. No. 11/904,505 dated Feb. 3, 2011; 13 pages.
USPTO Non Final Rejection for U.S. Appl. No. 11/904,506 dated Aug. 31, 2010; 17 pages.
USPTO Requirement for Restriction for U.S. Appl. No. 13/007,533 dated Dec. 6, 2011; 7 pages.
USPTO Requirement for Restriction for U.S. Appl. No. 13/114,889 dated Sep. 7, 2011; 6 pages.
USPTO Requirement for Restriction for U.S. Appl. No. 13/551,237 dated Jun. 17, 2013; 5 pages.
USPTO Requirement Restriction for U.S. Appl. No. 12/197,466 dated Mar. 11, 2011; 5 pages.
USPTO Restriction Requirement for U.S. Appl. No. 13/436,875 dated Oct. 18, 2013; 8 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application Number PCT/US08/06627 mailed Aug. 26, 2008; 5 pages.
Written Opinion of the International Searching Authority for International Application No. PCT/13US/32777 dated Jun. 20, 2013; 7 pages.
Written Opinion of the International Searching Authority for International Application No. PCT/US07/20966 mailed Apr. 21, 2008; 1 pages.
Written Opinion of the International Searching Authority for International Application No. PCT/US07/20988 mailed Mar. 14, 2008; 1 page.
Written Opinion of the International Searching Authority for International Application No. PCT/US12/21583 mailed May 8, 2012; 4 pages.
Written Opinion of the International Searching Authority for International Application No. PCT/US13/29784 mailed May 20, 2013; 6 pages.
Written Opinion of the International Searching Authority for International Application No. PCT/US13/32339 mailed May 30, 2013; 7 pages.
Written Opinion of the International Searching Authority for the International Application No. PCT/US 12/21583 dated May 8, 2012; 7 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.

* cited by examiner

US 8,685,813 B2

METHOD OF INTEGRATING A CHARGE-TRAPPING GATE STACK INTO A CMOS FLOW

RELATED APPLICATIONS

This application claims the benefit of priority under 35 U.S.C. 119(e) to U.S. Provisional Patent Application Ser. No. 61/599,258, filed Feb. 15, 2012, which is incorporated by reference herein.

TECHNICAL FIELD

The present disclosure relates generally to the field of semiconductor devices, and more particularly to methods of integrating a charge-trapping gate stack into a CMOS flow.

BACKGROUND

Integrated circuits including logic devices and interface circuits based upon metal-oxide-semiconductor field-effect transistors (MOSFETs) are typically fabricated using a standard complimentary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOSFETs will function properly. For many applications it is desirable to include non-volatile memory devices based upon FETs including charge-trapping gate stacks in the integrated circuit. Charge-trapping gate stack formation involves the formation of a nitride or oxynitride charge-trapping layer sandwiched between two dielectric or oxide layers typically fabricated using materials and processes that differ significantly from those of the standard CMOS process flow, and which can detrimentally impact or be impacted by the fabrication of the MOSFETs. In particular, forming a gate oxide or dielectric of a MOSFET can significantly degrade performance of a previously formed charge-trapping gate stack by altering a thickness or composition of the charge-trapping layer.

BRIEF DESCRIPTION OF THE DRAWINGS

These and various other features of methods of integrating formation of a charge-trapping gate stack into a CMOS flow will be apparent upon reading of the following detailed description in conjunction with the accompanying drawings and the appended claims provided below, where:

DETAILED DESCRIPTION

Figure 1A:
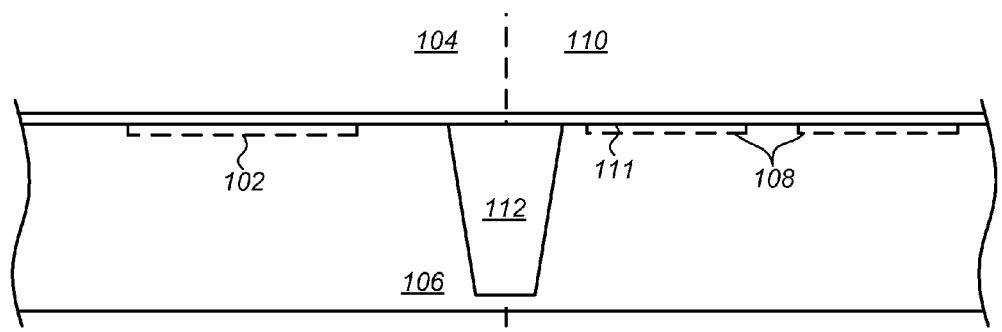
FIGS. 1a-1q are block diagrams illustrating an embodiment of a method of fabricating an integrated circuit including a metal-oxide-semiconductor field-effect transistors (MOSFET) and a non-volatile memory device including a charge-trapping gate stack.

Embodiments of the present invention disclose methods of integrating a charge-trapping gate stack into a CMOS flow. In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

A method of integrating a memory device including a charge-trapping gate stack into a CMOS flow is described. In an embodiment, the method begins with forming a channel of the memory device in a first region of a substrate and a channel of a MOS device in a second region. Next, a dielectric stack is formed on a surface of the substrate overlying at least the channel of the memory device, the dielectric stack including a tunneling dielectric overlying the surface of the substrate and a charge-trapping layer overlying the tunneling dielectric, and a cap layer formed overlying the dielectric stack. The cap layer and the dielectric stack are patterned to form a gate stack overlying the channel of the memory device and to remove the cap layer and the dielectric stack from the second region of the substrate. Finally, an oxidation process is performed to form a gate oxide overlying the channel of the MOS device in the second region while simultaneously oxidizing the cap layer to form a blocking oxide overlying the charge-trapping layer. The oxidation process can include in-situ-steam-generation (ISSG), chemical vapor deposition (CVD), or radical oxidation performed in a batch or single substrate processing chamber with or without an ignition event such as plasma. Generally, the oxidation process consumes substantially the entire cap layer, as well as a portion of the charge trapping layer.

In certain embodiments, the cap layer is a multi-layer cap layer including a first cap layer adjacent to the charge-trapping layer and a second cap layer overlying the first cap layer. The first and second cap layers can include nitride layer having differing stoichiometry composition. The second cap layer is removed in a clean process, such as a wet clean process, after patterning the dielectric stack and prior to performing the oxidation process, and the first cap layer is consumed in the oxidation process.

In other embodiments, an oxide layer or sacrificial oxide is formed over the second cap layer prior to patterning and both the sacrificial oxide and second cap layer are removed during a wet clean process.

An embodiment of a method for integrating a circuit including a metal-oxide-semiconductor field-effect transistor (MOSFET) and a non-volatile memory device including a charge-trapping gate stack will now be described in detail with reference to FIGS. 1A through 1q.

Referring to FIG. 1a, the process begins with forming a channel 102 for a memory device in a first region 104 of a substrate 106 and channels 108 for one or more MOS devices in a second region 110 of the substrate. The substrate 106 may be a bulk wafer composed of any single crystal material suitable for semiconductor device fabrication, or may include a top epitaxial layer of a suitable material formed on a substrate. Suitable materials include, but are not limited to, silicon, germanium, silicon-germanium or a III-V compound semiconductor material.

Generally, the channels 102, 108, are formed by implantation of appropriate ion species through a pad oxide 111 in both the first region 104 and the second region 110. For example, $BF_2$ can be implanted at an energy of from about 5 to about 100 kilo-electron volts (keV), and a dose of from about 1e14 $cm^{-2}$ to about 1e16 $cm^{-2}$ to form an N-type non-volatile memory device. A P-type device may likewise be formed by implantation of Arsenic or Phosphorous ions at any suitable dose and energy. It is to be appreciated that implantation can be used to form channels 102, 108, in both regions of the substrate 106 at the same time, or at separate times using standard lithographic techniques, including a patterned photoresist layer to mask one of the regions. The pad oxide 111 is silicon dioxide ($SiO_2$) having a thickness of from about 10 nanometers (nm) to about 20 nm and can be grown by a thermal oxidation process or in-situ steam generation (ISSG).

In some embodiments, such as that shown, isolation structures 112 may be formed in the substrate 106 to electrically isolate a memory device formed in the first region 104 from a MOS device formed in the second region 110. Isolation structures 112 are formed prior to forming the pad oxide 111 and channels 102, 108, and may be formed by any conventional technique, such as, but not limited to shallow trench isolation (STI) or local oxidation of silicon (LOCOS).

Figure 1B:
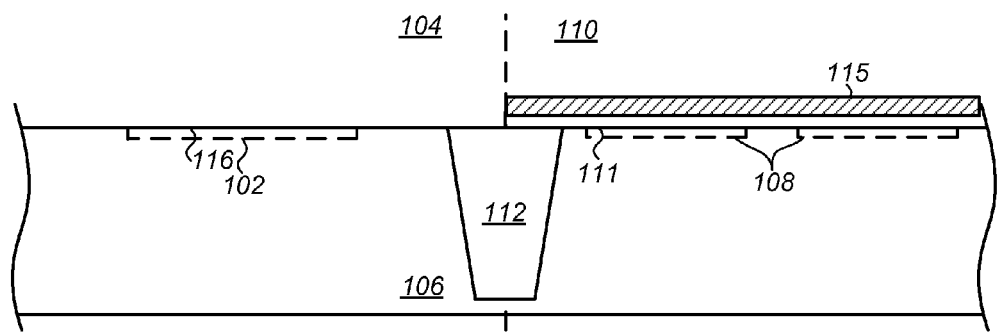

Next, referring to FIG. 1b a patterned mask layer 115 is formed on or overlying the pad oxide 111 and the pad oxide etched or patterned to remove the oxide from the first region 104 of the substrate 106. The patterned mask layer 115 can include a photoresist layer patterned using standard lithographic techniques, and the pad oxide 111 can be etched or removed using a wet or dry etch process to stop on a surface of the substrate 106. In one exemplary embodiment, the pad oxide 111 is removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 1C:
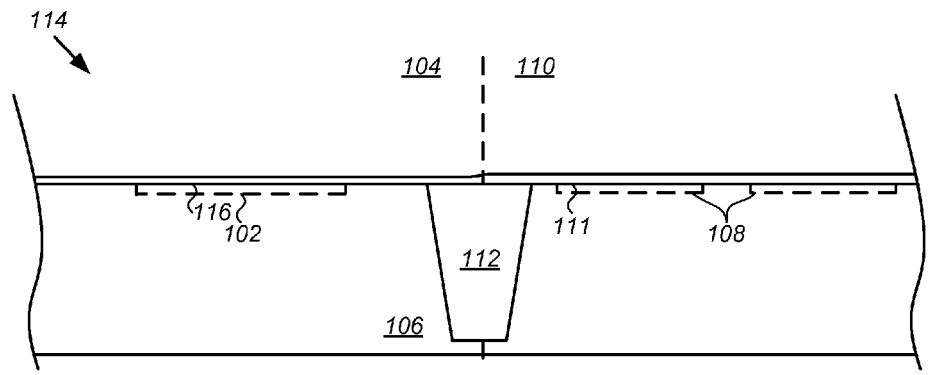

Referring to FIG. 1c, a dielectric stack 114 is formed, beginning with the formation of a tunnel dielectric 116 over at least the channel 102 of the memory device in the first region 104 of the substrate 106. The tunnel dielectric 116 may be any material and have any thickness suitable to allow charge carriers to tunnel into the charge trapping layer under an applied gate bias while maintaining a suitable barrier to leakage when the memory device is unbiased. In certain embodiments, tunnel dielectric 116 is silicon dioxide, silicon oxy-nitride, or a combination thereof and can be grown by a thermal oxidation process, in-situ steam generation (ISSG), or radical oxidation.

For example, in one embodiment a silicon dioxide tunnel dielectric 116 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of −900-1000° C. at a pressure approximately in the range of 0.5-5 Torr to form radicals, such as, an OH radical, an $HO_2$ radical or an O diradical, at the surface of substrate. The radical oxidation process is carried out for a duration approximately in the range of 1-10 minutes to effect growth of a tunnel dielectric 116 having a thickness of from about 1.5 nanometers (nm) to about 3.0 nm by oxidation and consumption of the exposed surface of substrate. It will be understood that in this and in subsequent figures the thickness of tunnel dielectric 116 is exaggerated relative to the pad oxide 111, which is approximately 7 times thicker, for the purposes of clarity. A tunnel dielectric 116 grown in a radical oxidation process is both denser and is composed of substantially fewer hydrogen atoms/$cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 116 without impacting the throughput (wafers/hr.) requirements that a fabrication facility may require.

In another embodiment, tunnel dielectric layer 116 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric 116 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Figure 1D:
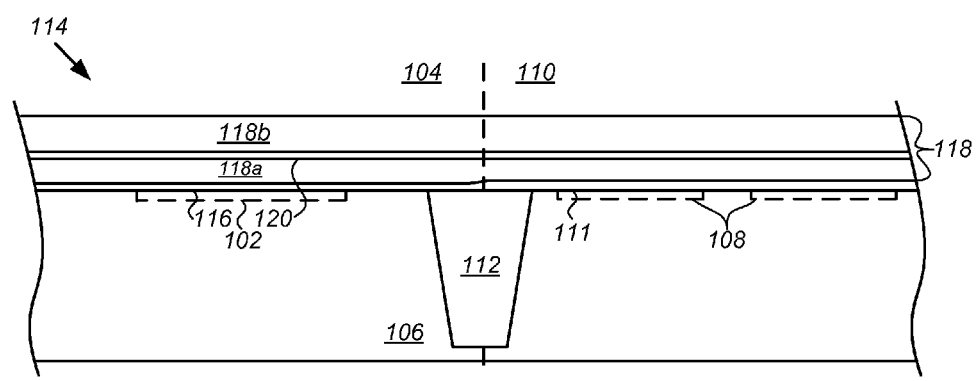

Referring to FIG. 1d, a charge-trapping layer 118 is formed on or overlying the tunnel dielectric 116. Generally, as in the embodiment shown, the charge-trapping layer 118 is a multi-layer charge-trapping layer including at least a lower or first charge-trapping layer 118a closer to the tunnel dielectric 116, and an second charge-trapping layer 118b that is oxygen-lean relative to the first charge-trapping layer and comprises a majority of a charge traps distributed in multi-layer charge-trapping layer.

The first charge-trapping layer 118a of a multi-layer charge-trapping layer 118 can include a silicon nitride ($Si_3N_4$), silicon-rich silicon nitride or a silicon oxy-nitride ($SiO_xN_y$ ($H_z$)). For example, the first charge-trapping layer 118a can include a silicon oxynitride layer having a thickness of between 2.0 nm and 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 118b of the multi-layer charge-trapping layer 118 is then formed over the first charge-trapping layer 118a. The second charge-trapping layer 118b can include a silicon nitride and silicon oxy-nitride layer having a stoichiometric composition of oxygen, nitrogen and/or silicon different from that of the first charge-trapping layer 118a. The second charge-trapping layer 118b can include a silicon oxynitride layer having a thickness of between 2.0 nm and 5.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

In some embodiments, the multi-layer charge-trapping layer 118 is a split charge-trapping layer, further including a thin, middle oxide layer 120 separating the first charge-trapping layer 118a and the second charge-trapping layer 118b. The middle oxide layer 120 substantially reduces the probability of electron charge that accumulates at the boundaries of the second charge-trapping layer 118b during programming from tunneling into the first charge-trapping layer 118a, resulting in lower leakage current than for the conventional memory devices.

In one embodiment, the middle oxide layer 120 is formed by oxidizing to a chosen depth using thermal or radical oxidation. Radical oxidation may be performed, for example, at a temperature of 1000-1100° C. using a single wafer tool, or 800-900° C. using a batch reactor tool. A mixture of $H_2$ and $O_2$ gasses may be introduced to a process chamber at a ratio of approximately 1:1 and a pressure of 300-500 Tor for a batch process, or 10-15 Tor using a single vapor tool, for a time of 1-2 minutes using a single wafer tool, or 30 min to 1 hour using a batch process. In some embodiments, the radical oxidation process is without an ignition event, such as forming of a plasma, which would otherwise typically be used to pyrolyze the $H_2$ and $O_2$ to form steam. Instead, the $H_2$ and $O_2$ are permitted to react at a surface of the first charge-trapping layer 118a to form radicals, such as, an OH radical, an $HO_2$ radical or an O diradical, to form the middle oxide layer 120.

Figure 1E:
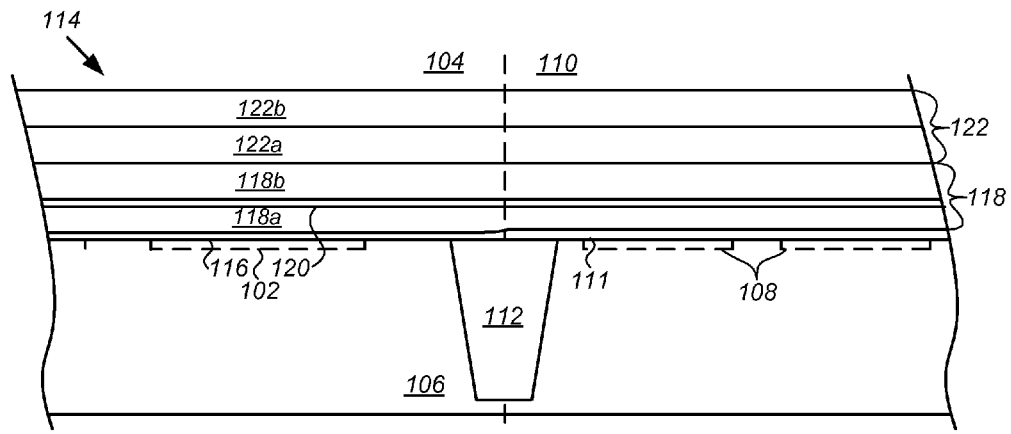

Referring to FIG. 1e, a cap layer 122 is formed on or overlying the dielectric stack 114 or the charge-trapping layer 118. In one embodiment, the cap layer 122 includes a silicon nitride all or part of which is subsequently oxidized in a later step to form a blocking oxide overlying the charge-trapping layer 118. The cap layer 122 can be a single layer of nitride having a homogeneous composition, a single layer of nitride having a gradient in stoichiometric composition, or, as in the embodiment shown, can be a multi-layer cap layer including at least a lower or first cap layer 122a overlying the charge-trapping layer 118, and a second cap layer 122b overlying the first cap layer 122a.

In one embodiment, the first cap layer 122a can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Similarly, the second cap layer 122b can also include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Optionally, the first cap layer 122a and second cap layer 122b can comprise different stoichiometries. For example, the second cap layer 122b can comprise a silicon or oxygen rich composition relative to the first cap layer 122a to facilitate removal of the second cap layer in a dry or wet clean process prior to oxidizing the first cap layer. Alternatively, the first cap layer 122a can comprise a silicon or oxygen rich composition relative to the second cap layer 122b to facilitate oxidation of the first cap layer.

Figure 1F:
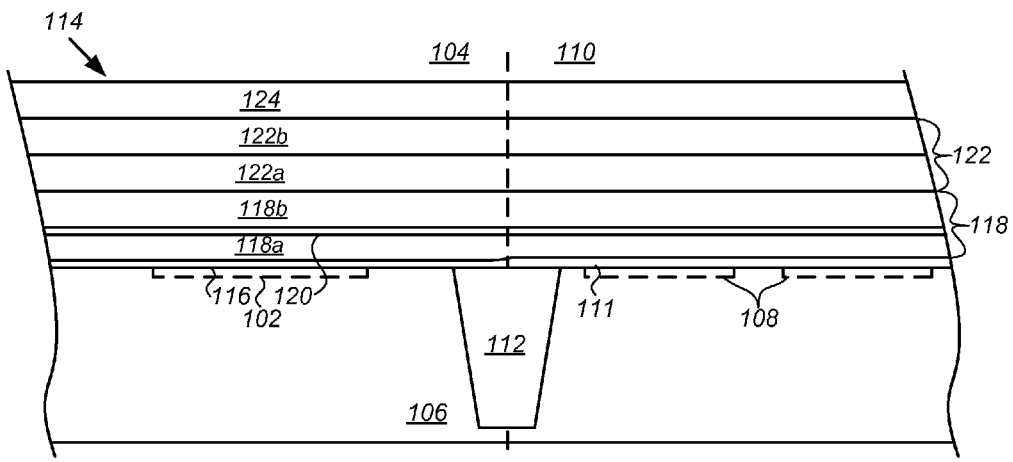

Referring to FIG. 1f, a sacrificial oxide layer 124 is formed on or overlying the dielectric stack 114 or the cap layer 122. In one embodiment, the sacrificial oxide layer 124 can include a silicon dioxide layer grown by a thermal oxidation process, in-situ steam generation (ISSG), or radical oxidation, and having a thickness of between 2.0 nm and 4.0 nm. In another embodiment, the sacrificial oxide layer 124 can be formed or deposited by a chemical vapor deposition process in a low pressure chemical vapor deposition (LPCVD) chamber. For example, the sacrificial oxide layer 124 can be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer.

Figure 1G:
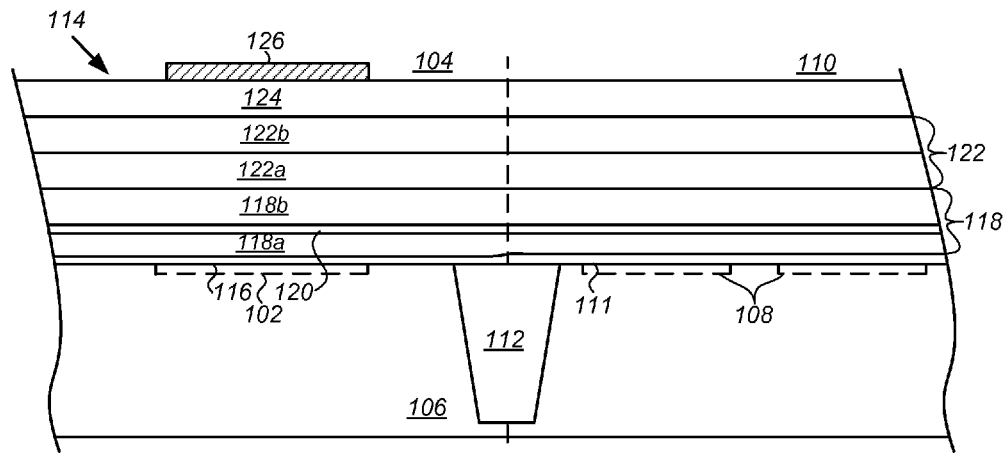
Figure 1H:
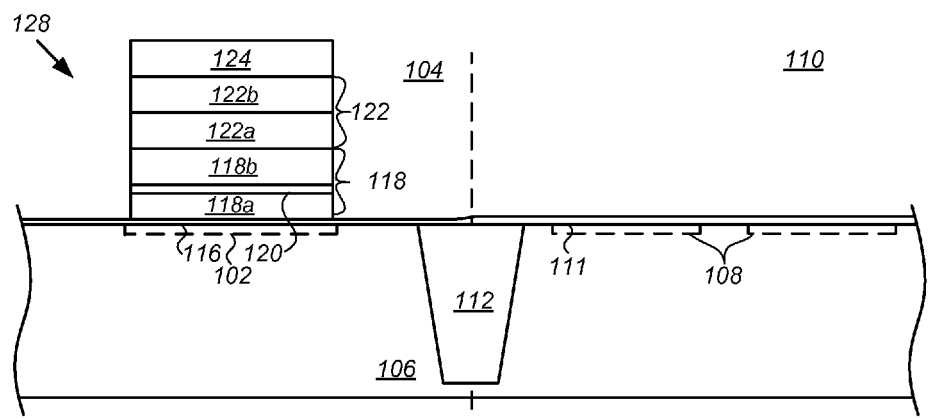

Next, referring to FIG. 1g, a patterned mask layer 126 is formed on or overlying the sacrificial oxide layer 124, and, referring to FIG. 1h, the sacrificial oxide, cap layer 122 and the dielectric stack 114 etched or patterned to form a gate stack 128 overlying the channel 102 of the memory device and to remove the sacrificial oxide, cap layer and the dielectric stack from the second region 110 of the substrate 106. The patterned mask layer 126 can include a photoresist layer patterned using standard lithographic techniques, and the sacrificial oxide 124, cap layer 122 and dielectric stack 114 can be etched or removed using a the dry etch process including one or more separate steps to stop on a surface of the tunnel dielectric 116 and the pad oxide 111.

Figure 1I:
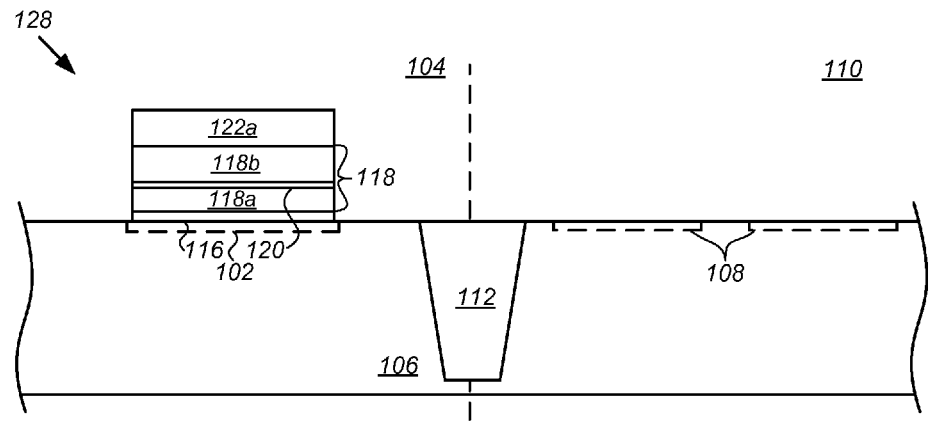

Referring to FIG. 1i, the sacrificial oxide 124 and a portion of the cap layer 122 or substantially of all of a top most layer in a multi-layer cap layer are removed from the gate stack 128 in a highly selective cleaning process. This cleaning process further removes any oxide, such as an oxide tunnel dielectric 116 and pad oxide 111, remaining in the first region 104 outside the gate stack 128 and in the second region 110 to prepare the substrate 106 in that region for gate oxide growth. In one exemplary implementation the sacrificial oxide 124 and the second cap layer 122b are removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 1J:
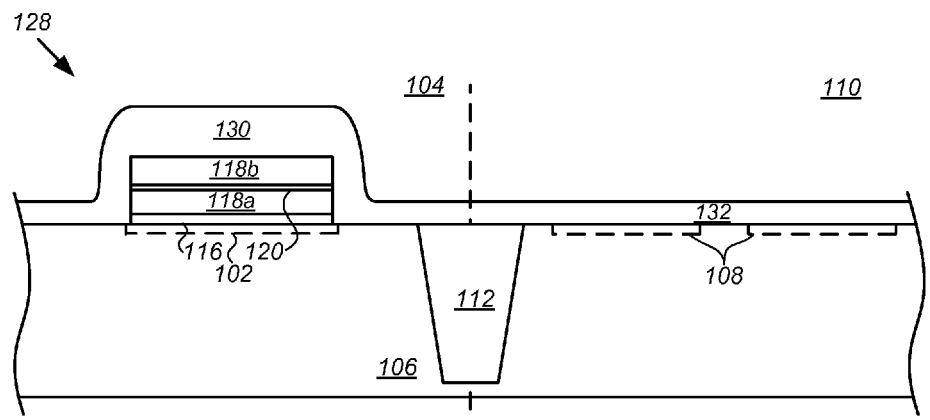

Next, referring to FIG. 1j, an oxidation process is performed to oxidize the remaining portion of the cap layer 122 or the first cap layer 122a of a multi-layer cap layer, and a portion of the second charge-trapping layer 118b to form a blocking oxide layer 130 overlying the second charge-trapping layer. In one embodiment, the oxidation process is adapted to oxidize the first cap layer 122a to form the blocking oxide layer 130 while simultaneously oxidizing at least a portion of a surface of the substrate 106 in the second region 110 to form a first gate oxide 132 overlying at least the channel 108 of at least one MOS device. The oxidation process can include in-situ-steam-generation (ISSG), CVD, or radical oxidation performed in a batch or single substrate processing chamber with or without an ignition event such as plasma. For example, in one embodiment the blocking oxide layer 130 and the gate oxide 132 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of the cap layer 122 or the first cap layer 122a. The radical oxidation process is carried out for a duration approximately in the range of 10-15 minutes to effect growth of a blocking oxide layer 130 by oxidation and consumption of the first cap layer 122a and a portion of the second charge-trapping layer 118b having a thickness of from about 3 nm to about 4.5 nm, and gate oxide 132 having a thickness of from about 5 nm to about 7 nm.

Figure 1K:
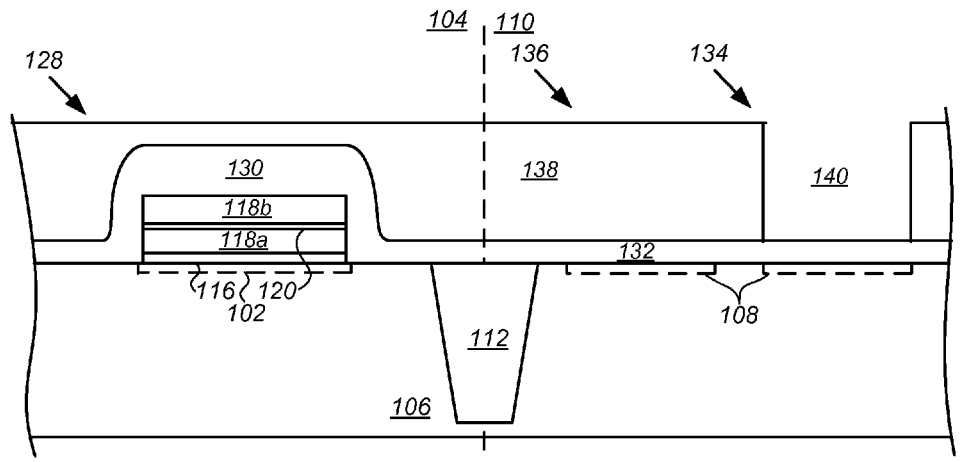

In some embodiments, such as that shown in FIGS. 1k to 1q, the method further includes a dual gate oxide process flow to enable fabrication of both a MOS device 134 and a HV MOS device 136. Referring to FIG. 1k, a patterned mask layer 138 is formed over the first and second regions 104, 110 of the substrate 106. The patterned mask layer 138 can be a photoresist layer patterned using standard lithographic techniques, and includes at least one opening 140 over a channel 108 in the second region 110. The thick, first gate oxide 132 is etched in the exposed regions by using a BOE etch, under conditions similar to those described above with respect to removing the sacrificial oxide 124, and the patterned mask layer 138 is then removed.

Figure 1L:
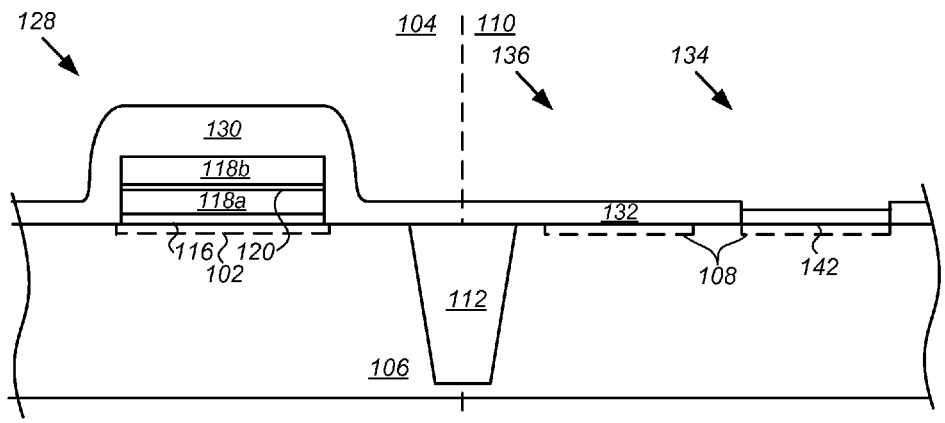

Referring to FIG. 1l, the substrate 106 is cleaned using a wet etch that does not etch oxide in order to protect the first gate oxide 132 of the HV MOS device 136, and the second gate oxide 142 of the gate stack 128 and the first gate oxide 132. The substrate 106 is then subjected to a thermal oxidation process to grow a thin, second gate oxide 142 having a thickness from about 1.5 nm to about 3 nm.

Figure 1M:
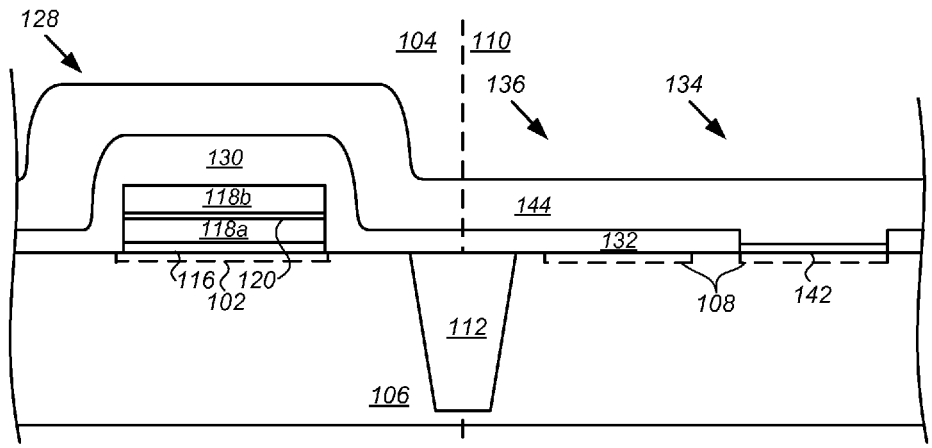

Referring to FIG. 1m, a gate layer 144 of any conducting or semiconducting material suitable for accommodating a biasing of the memory device and operation of the MOS device is formed over the gate stack 128, the first gate oxide 132 of the HV MOS device 136, and the second gate oxide 142 of the MOS device 134. In one embodiment, the gate layer is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of doped poly-crystalline silicon.

Figure 1N:
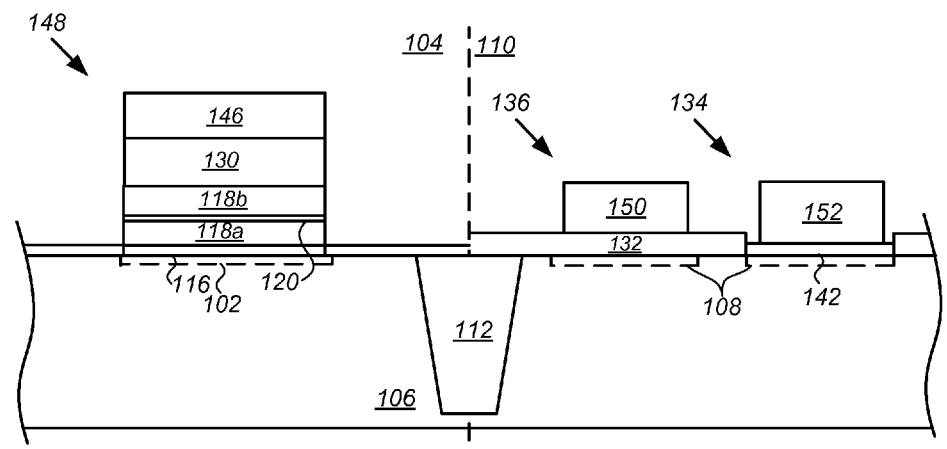

Referring to FIG. 1n, the gate layer 144 is patterned using a mask layer (not shown) and standard lithographic techniques to stop on surfaces of the blocking oxide layer 130, the first gate oxide 132 and the second gate oxide 142, thereby forming a gate 146 for the gate stack 128 of a memory device 148, a gate 150 for the HV MOS device 136, and a gate 152 for the MOS device 134.

Figure 1O:
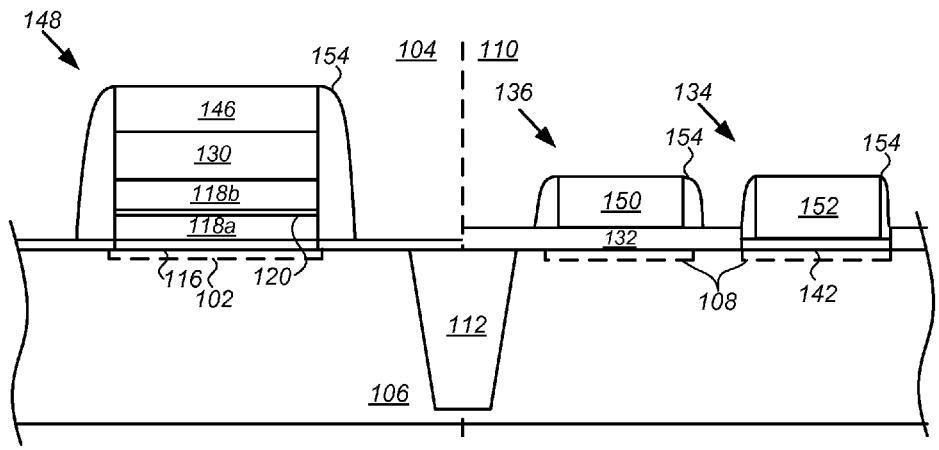
Figure 1P:
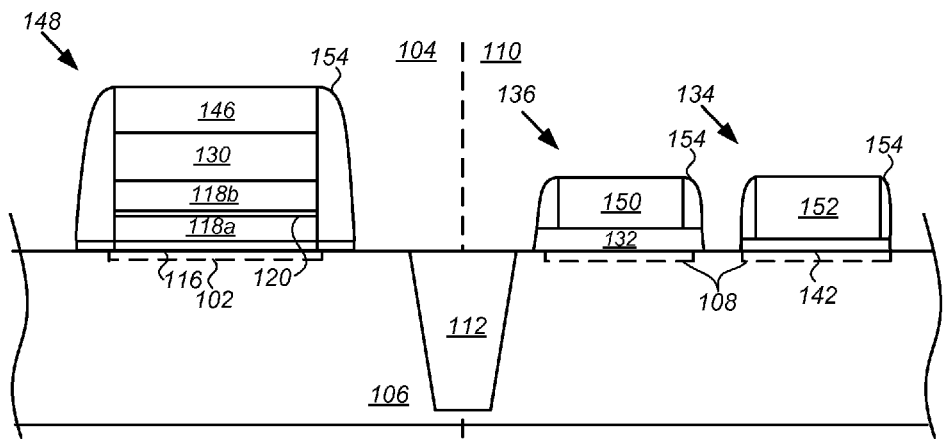

Referring to FIG. 1o, sidewall spacers 154 formed adjacent to the gates 146, 150, 152, for all devices, and remaining exposed portions of the blocking oxide layer 130, the first gate oxide 132 and the second gate oxide 142, anisotropically etched to yield the structure shown in FIG. 1p with substantially complete memory device 148, HV MOS device 136 and MOS device 134.

Figure 1Q:
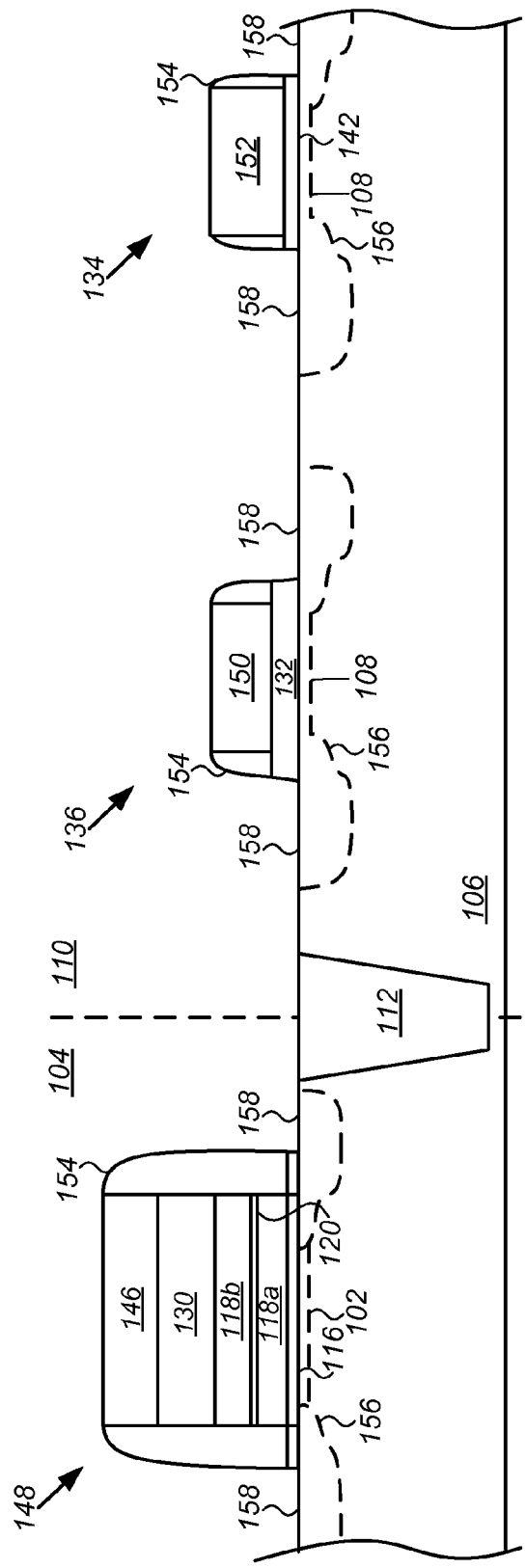

Referring to FIG. 1q, with the gate stack of the memory device 148, HV MOS device 136 and MOS device 134 substantially complete, tip and/or HALO implants may be performed to form extension regions 156, source and drain implants performed to form source and drain regions 158 for all devices.

Implementations and Alternatives

In another aspect the present disclosure is directed to multigate or multigate-surface memory devices including charge-trapping regions overlying two or more sides of a channel formed on or above a surface of a substrate, and methods of fabricating the same. A non-planar multigate device generally includes a horizontal or vertical channel formed on or above a surface of a substrate and surrounded on three or more sides by a gate.

Figure 2A:
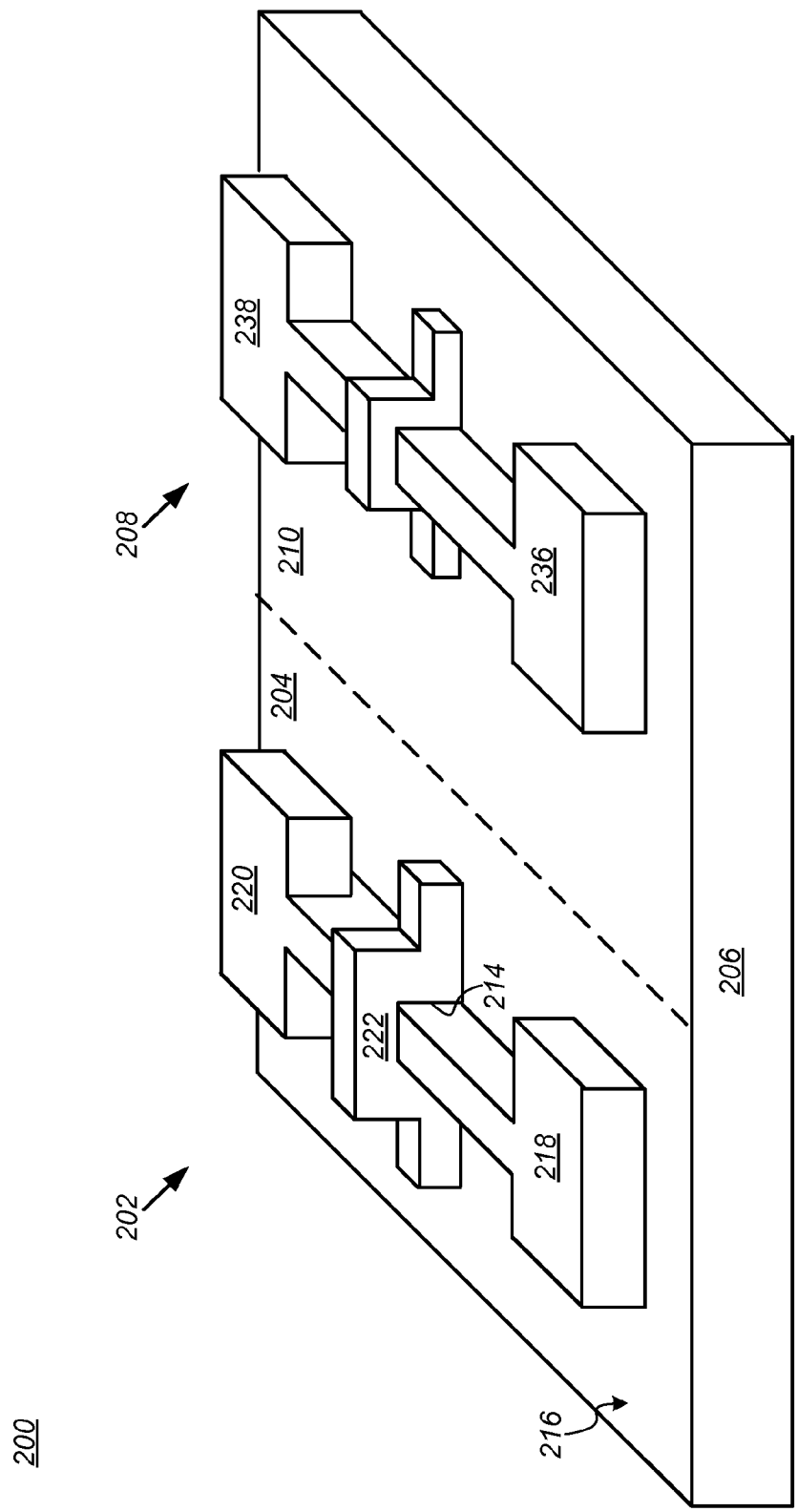
FIGS. 2A and 2B are block diagrams illustrating an integrated circuit including a MOSFET and a non-planar, multi-gate non-volatile memory device fabricated according to another embodiment of the present disclosure.

FIG. 2A illustrates one embodiment of an integrated circuit 200 including a non-planar multigate memory device 202 formed above a first region 204 of a substrate 206, and a MOS device 208 integrally formed adjacent thereto in a second region 210.

Referring to FIG. 2A, the memory device 202, commonly referred to as a finFET, includes a channel 214 formed from a thin film or layer of semiconducting material overlying a surface 216 on the substrate 206 connecting a source 218 and a drain 220 of the memory device. The channel 214 is enclosed on three sides by a fin which forms a gate stack 222 of the device. The thickness of the gate stack 222 (measured in the direction from source to drain) determines the effective channel length of the device.

Figure 2B:
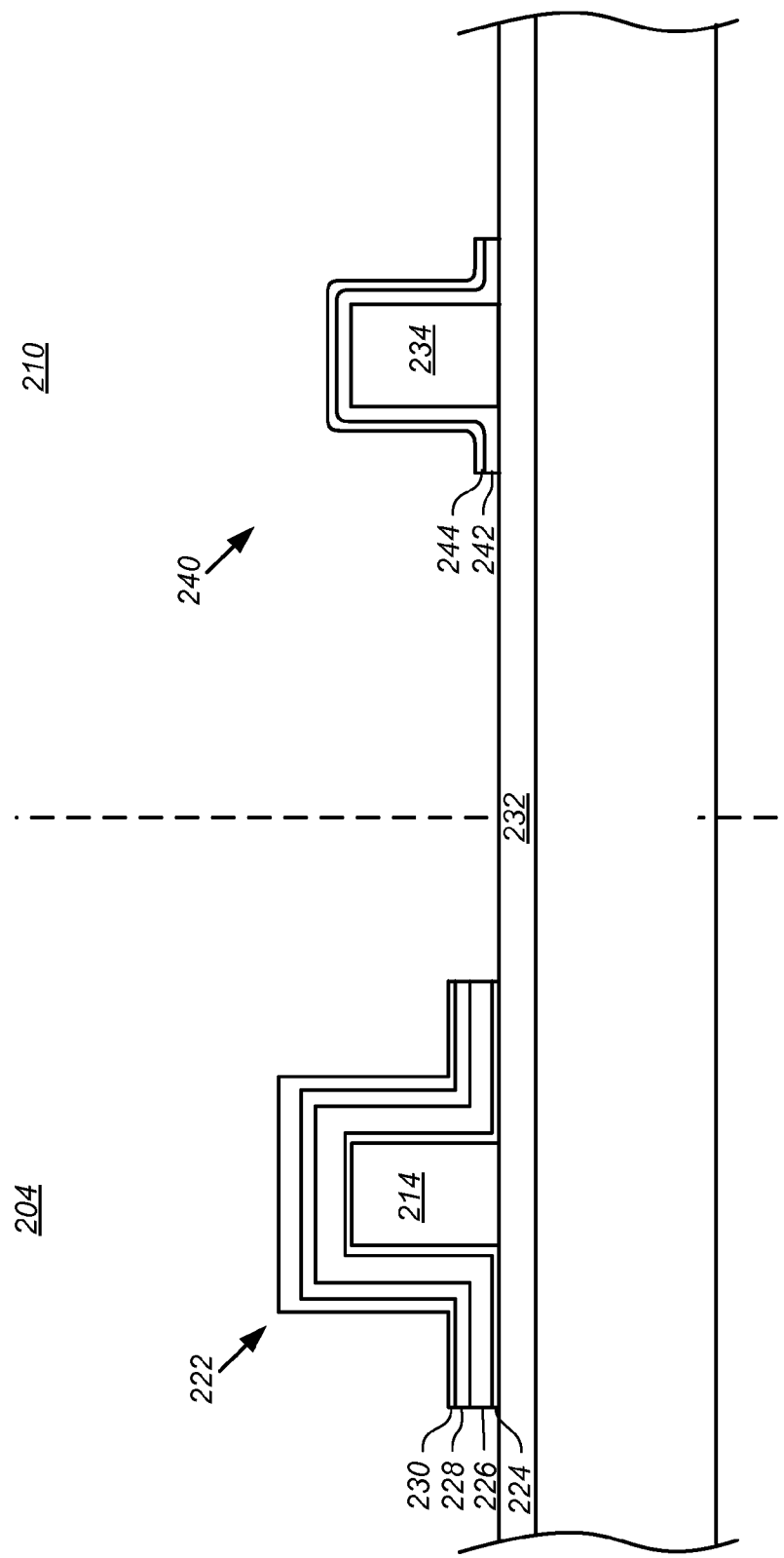

In accordance with the present disclosure, the non-planar multigate memory device 202 of FIG. 2A can include a multilayer charge-trapping layer and a blocking oxide layer formed by oxidation and consumption of a cap layer and a portion of the charge-trapping layer. FIG. 2B is a cross-sectional view of a portion of the non-planar memory device of FIG. 2A including a portion of the substrate 206, channel 214 and the gate stack 222. The gate stack 222 includes a tunnel dielectric 224 overlying the raised channel 214, a charge-trapping layer 226, a blocking oxide layer 228 and a gate layer 230 overlying the blocking layer to form a control gate of the memory device 202. As described above, the gate layer 230 can include a doped polysilicon or a metal layer. The channel 214 and gate stack 222 can be formed directly on substrate 206 or on an insulating or dielectric layer 232, such as a buried oxide layer, formed on or over the substrate.

Although not shown in these figures, it will be understood the charge-trapping layer 226 can be multi-layer charge-trapping layer including at least one lower or first charge-trapping layer comprising nitride closer to the tunnel dielectric 224, and an upper or second charge-trapping layer overlying the first charge-trapping layer. Generally, the second charge-trapping layer comprises a silicon-rich, oxygen-lean nitride layer and comprises a majority of a charge traps distributed in multiple charge-trapping layers, while the first charge-trapping layer comprises an oxygen-rich nitride or silicon oxynitride, and is oxygen-rich relative to the top charge-trapping layer to reduce the number of charge traps therein. By oxygen-rich it is meant wherein a concentration of oxygen in the first charge-trapping layer is from about 15 to about 40%, whereas a concentration of oxygen in second charge-trapping layer is less than about 5%. In some embodiments, the multilayer charge-trapping layer further includes at least one thin, intermediate or middle oxide layer separating the second charge-trapping layer from the first charge-trapping layer.

Finally, the blocking oxide layer 228 can include an oxide formed by oxidation and consumption of a cap layer and a portion of the charge-trapping layer 226, as described above with reference to FIGS. 1A-1q.

In the embodiment shown in FIG. 2A, the MOS device 208 is also a finFET, and includes a channel 234 formed from a thin film or layer of semiconducting material overlying the surface 216 of the substrate 206 connecting a source 236 and a drain 238 of the MOS device. The channel 234 is also enclosed on three sides by a fin or gate which forms a gate 240 of the MOS device 208. Referring to FIG. 2B gate 240 of the MOS device 208 includes a gate oxide 242 overlying the raised channel 234 and a metal or doped polysilicon gate layer 244 overlying the gate oxide.

Figure 3:
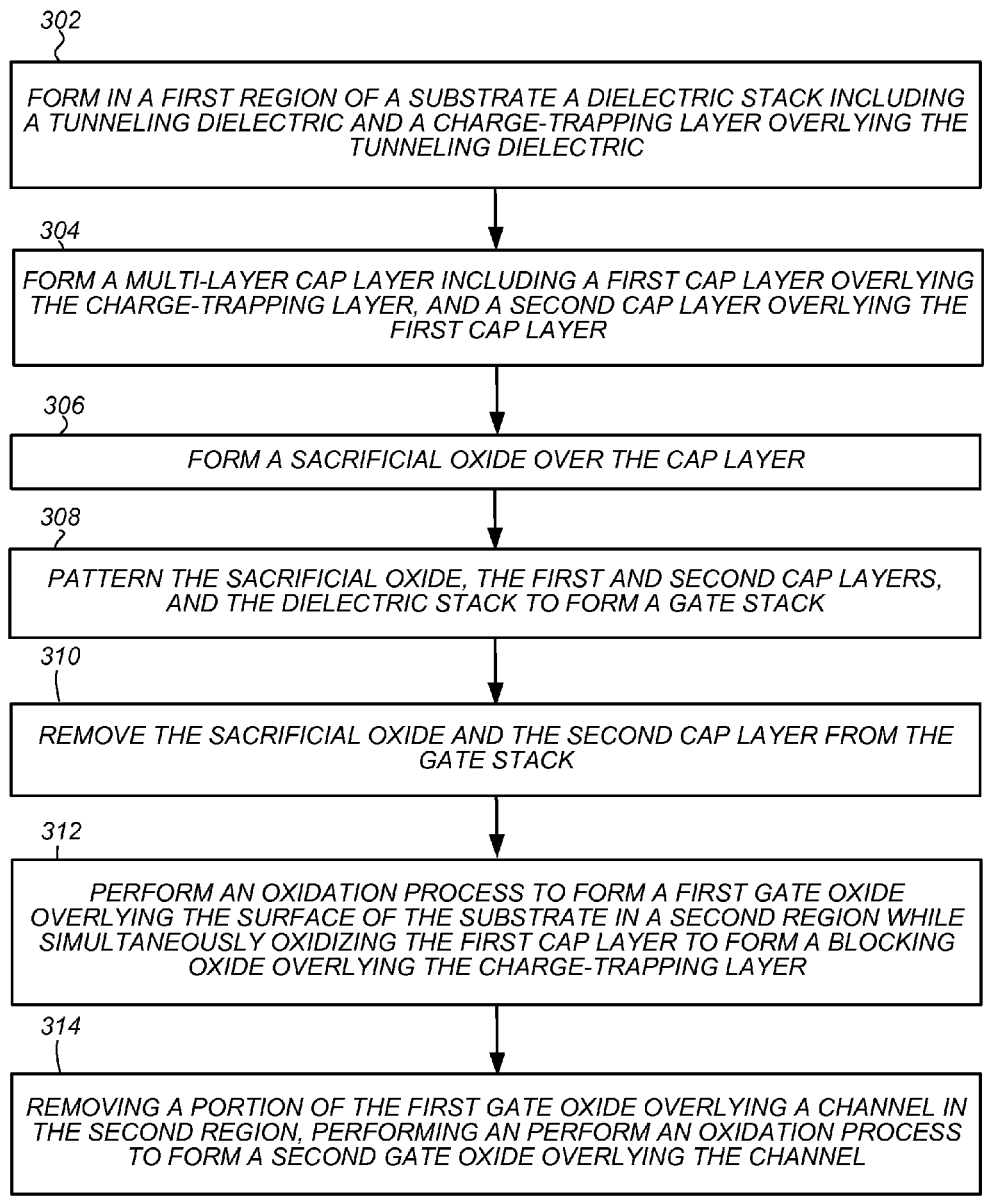
FIG. 3 is a flow diagram depicting sequences of particular modules employed in the fabricating an integrated circuit including a MOSFET and a non-planar, multi-gate non-volatile memory device.

FIG. 3 illustrates a flow diagram depicting sequences of particular modules that may be employed in the fabrication process of a non-volatile charge trap memory device integrated with a logic MOS device, in accordance with either the embodiment shown in FIGS. 1A-1*q*, or the embodiment shown in FIG. 2A or 2B.

Referring to FIG. 3, the method begins with forming a dielectric stack in at least a first region of a substrate, the dielectric stack including a tunneling dielectric overlying a surface of the substrate and a charge-trapping layer overlying the tunneling dielectric (module 302). Next, a multi-layer cap layer is formed including a first cap layer overlying the charge-trapping layer, and a second cap layer overlying the first cap layer (module 304). A sacrificial oxide is formed over the cap layer (module 306), and the sacrificial oxide, the first and second cap layers, and the dielectric stack patterned to form a gate stack in the first region of the substrate, and to remove the sacrificial oxide, cap layer and dielectric stack from a second region of the substrate. (module 308). The sacrificial oxide and the second cap layer are then removed from the gate stack in a wet clean process (module 310). Finally, an oxidation process is performed to form a first gate oxide overlying the surface of the substrate in a second region while simultaneously oxidizing the first cap layer to form a blocking oxide overlying the charge-trapping layer (module 312).

In those embodiments in which the process includes a dual gate oxide process to fabricate both MOS and HV MOS devices in the second region of the substrate, the process further includes removing a portion of the first gate oxide overlying a channel in the second region, and performing an oxidation process to form a thinner, second gate oxide overlying the channel (module 314). As described above with respects to FIGS. 1*k* to 1*l*, this can be accomplished using a patterned mask layer and standard lithographic techniques. The thinner, second gate oxide can be thermally grown to a thickness of from about 1.5 nm to about 3 nm using a thermal oxidation process similar to that used to grow the first gate oxide.

Thus, embodiments of integrated circuit including a MOSFET and a non-volatile memory device including a charge-trapping gate stack and methods of forming the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the hot de-latch system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method comprising:
   forming a dielectric stack on a surface of a substrate, the dielectric stack including a tunneling dielectric overlying the surface of the substrate and a charge-trapping layer overlying the tunneling dielectric;
   forming a cap layer overlying the dielectric stack, wherein the cap layer comprises a multi-layer cap layer including at least a first cap layer overlying the charge-trapping layer, and a second cap layer overlying the first cap layer;
   patterning the cap layer and the dielectric stack to form a gate stack of a memory device in a first region of the substrate and to remove the cap layer and the charge-trapping layer from a second region of the substrate;
   removing the second cap layer; and
   performing an oxidation process to form a gate oxide of a metal-oxide-semiconductor (MOS) device overlying the surface of the substrate in the second region while simultaneously oxidizing the cap layer to form a blocking oxide overlying the charge-trapping layer, wherein the oxidation process consumes substantially all of the first cap layer.

2. The method of claim 1, wherein the first cap layer and the second cap layer comprise silicon nitride or silicon oxynitride.

3. The method of claim 2, wherein the second cap layer comprises a stoichiometry different from the first cap layer.

4. The method of claim 1, further comprising removing the tunneling dielectric and a pad oxide overlying the surface of the substrate in the second region prior to performing the oxidation process.

5. The method of claim 4, further comprising forming a sacrificial oxide over the second cap layer, and wherein removing the second cap layer further comprises removing the sacrificial oxide and the tunneling dielectric.

6. The method of claim 1, wherein the oxidation process is a radical oxidation process comprising flowing hydrogen ($H_2$) gas and oxygen ($O_2$) gas are flowed into a process chamber in which the substrate is placed to form radicals at a surface of cap layer and the surface of the substrate in the second region.

7. The method of claim 1, wherein the oxidation process consumes a portion of the charge-trapping layer.

8. The method of claim 7, wherein the charge-trapping layer comprises a multi-layer charge-trapping layer including at least a first charge-trapping layer closer to the tunneling dielectric, and an second charge-trapping layer that is oxygen-lean relative to the first charge-trapping layer and comprises a majority of a charge traps distributed in multi-layer charge-trapping layer.

9. The method of claim 8, wherein the multi-layer charge-trapping layer further comprises an oxide layer separating the first charge-trapping layer and the second charge-trapping layer.

10. The method of claim 8, wherein the second charge-trapping layer comprises a thickness determined by the portion of the charge-trapping layer consumed in the oxidation process.

11. The method of claim 1, further comprising prior to forming the dielectric stack on the surface of the substrate forming a channel of the memory device in the first region of the substrate and a channel of the MOS device in the second region.

12. The memory device of claim 11, wherein the channel of the memory device is formed from a semiconducting material overlying the surface of the substrate, and wherein the dielectric stack overlies and abuts the channel of the memory device on at least two sides thereof.

13. A method comprising:
   forming a dielectric stack in at least a first region of a substrate, the dielectric stack including a tunneling dielectric overlying a surface of the substrate and a charge-trapping layer overlying the tunneling dielectric;
   forming a cap layer overlying the dielectric stack;
   forming a sacrificial oxide over the cap layer;
   patterning the sacrificial oxide, cap layer and dielectric stack to form a gate stack in the first region of the substrate, and to remove the sacrificial oxide, cap layer and dielectric stack from a second region of the substrate;
   removing the sacrificial oxide and a portion of the cap layer from the gate stack while removing the remaining dielectric from the second region; and
   performing an oxidation process to form a gate oxide overlying the surface of the substrate in the second region while simultaneously oxidizing the cap layer to form a blocking oxide overlying the charge-trapping layer.

14. The method of claim 13, wherein the cap layer comprises a multi-layer cap layer including at least a first cap layer overlying the charge-trapping layer, and a second cap layer overlying the first cap layer, and wherein removing a portion of the cap layer comprises removing the second cap layer.

15. The method of claim 14, wherein the second cap layer comprises a stoichiometry different from the first cap layer.

16. A method comprising:
   forming a dielectric stack in at least a first region of a substrate, wherein the dielectric stack includes a tunneling dielectric overlying a surface of the substrate and a charge-trapping layer overlying the tunneling dielectric;
   forming a first cap layer overlying the charge-trapping layer, and a second cap layer overlying the first cap layer;
   patterning the first and second cap layers and dielectric stack to form a gate stack in the first region of the substrate, and to remove the first and second cap layers and the dielectric stack from a second region of the substrate;
   removing the second cap layer from the gate stack in a wet clean process; and
   performing an oxidation process to form a gate oxide overlying the surface of the substrate in the second region while simultaneously oxidizing the first cap layer to form a blocking oxide overlying the charge-trapping layer.

17. The method of claim 16, wherein the second cap layer comprises a stoichiometry different from the first cap layer.

18. The method of claim 16, further comprising forming a sacrificial oxide over the second cap layer, and wherein patterning the first and second cap layers comprises patterning the sacrificial oxide in the first region of the substrate and removing the sacrificial oxide from the second region of the substrate, and wherein removing the second cap layer from the gate stack in a wet clean process comprises removing the sacrificial oxide.

* * * * *